(12) United States Patent
Deval et al.

(10) Patent No.: US 7,961,125 B2
(45) Date of Patent: Jun. 14, 2011

(54) METHOD AND APPARATUS FOR DITHERING IN MULTI-BIT SIGMA-DELTA DIGITAL-TO-ANALOG CONVERTERS

(75) Inventors: Philippe Deval, Lutry (CH); Vincent Quiquempoix, Divonne les Bains (FR); Alexandre Barreto, Morges (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/571,892

(22) Filed: Oct. 1, 2009

(65) Prior Publication Data
US 2010/0103013 A1 Apr. 29, 2010

Related U.S. Application Data

(60) Provisional application No. 61/107,820, filed on Oct. 23, 2008.

(51) Int. Cl.
*H03M 1/20* (2006.01)
(52) U.S. Cl. .......................... 341/131; 341/143; 341/144
(58) Field of Classification Search .................. 341/131, 341/143, 144, 200
See application file for complete search history.

(56) References Cited

U.S. PATENT DOCUMENTS

| | | | |
|---|---|---|---|
| 4,034,197 A | 7/1977 | Lawrence et al. | 235/156 |
| 4,606,004 A | 8/1986 | Crawford et al. | 364/414 |
| 4,965,668 A | 10/1990 | Abt et al. | 358/160 |
| 5,087,914 A * | 2/1992 | Sooch et al. | 341/120 |
| 5,252,973 A * | 10/1993 | Masuda | 341/131 |
| 5,406,283 A | 4/1995 | Leung | 341/143 |
| 6,172,628 B1 * | 1/2001 | Sculley et al. | 341/120 |
| 6,304,608 B1 | 10/2001 | Chen et al. | 375/252 |
| 6,388,595 B1 | 5/2002 | Edwards et al. | 341/131 |
| 6,426,714 B1 | 7/2002 | Ruha et al. | 341/143 |
| 6,462,685 B1 * | 10/2002 | Korkala | 341/131 |
| 6,515,601 B2 * | 2/2003 | Fukuhara et al. | 341/131 |
| 6,515,603 B1 * | 2/2003 | McGrath | 341/143 |
| 6,894,631 B1 | 5/2005 | Bardsley | 341/120 |
| 7,425,910 B1 * | 9/2008 | He et al. | 341/143 |

(Continued)

FOREIGN PATENT DOCUMENTS

DE 3509777 A1 9/1985

(Continued)

OTHER PUBLICATIONS

International PCT Search Report and Written Opinion, PCT/US2009/061597, 16 pages.

(Continued)

*Primary Examiner* — Khai M Nguyen
(74) *Attorney, Agent, or Firm* — King & Spalding L.L.P.

(57) ABSTRACT

A multi-bit (M-bit, M>1) Sigma-Delta digital-to-analog converter (DAC) with a variable resolution multi-bit quantizer that has its digital value inputs that are truncated or rounded to a resolution that follows a random or pseudo-random sequence to provide automatic dynamic dithering for removing undesired idle tones in the analog output of the Sigma-Delta DAC. Random numbers N(n) between 1 and M are provided, and M–N(n) least significant bits in each M-bit digital value at the output of the quantizer are forced to zero with a digital truncator or rounder. The random numbers N(n) may be provided by a random or pseudo-random sequence generator, e.g., Galois linear feedback shift register in combination with digital comparators and an adder.

10 Claims, 5 Drawing Sheets

U.S. PATENT DOCUMENTS

| | | | |
|---|---|---|---|
| 7,471,223 B2 * | 12/2008 | Lee | 341/131 |
| 2004/0036636 A1 * | 2/2004 | Mai et al. | 341/131 |
| 2005/0275577 A1 | 12/2005 | Bjornsen | 341/155 |
| 2006/0187105 A1 | 8/2006 | Sakata et al. | 341/155 |
| 2007/0040718 A1 | 2/2007 | Lee | 341/143 |
| 2007/0222656 A1 | 9/2007 | Melanson | 341/155 |

FOREIGN PATENT DOCUMENTS

| | | |
|---|---|---|
| EP | 1434354 A2 | 6/2004 |
| GB | 2175167 A | 11/1986 |
| WO | 00/44098 | 7/2000 |
| WO | 02/23728 | 3/2002 |
| WO | 2006/023355 A1 | 3/2006 |
| WO | 2008/014246 A1 | 1/2008 |

OTHER PUBLICATIONS

International PCT Search Report and Written Opinion, PCT/US2009/061599, 15 pages.

XP010536177, Gulati, K., et al., "A Low-Power Reconfigurable Analog-to-Digital Converter", Solid State Circuits Conference; Digest of Technical Papers, ISSCC.2001 IEEE International, Piscataway, NJ., 3 pages.

* cited by examiner

METHOD AND APPARATUS FOR DITHERING IN MULTI-BIT SIGMA-DELTA DIGITAL-TO-ANALOG CONVERTERS

RELATED PATENT APPLICATION

This application claims priority to commonly owned U.S. Provisional Patent Application Ser. No. 61/107,820; filed Oct. 23, 2008; entitled "Method and Apparatus for Dithering in Multi-Bit Sigma-Delta Digital-to-Analog Converters," by Philippe Deval, Vincent Quiquempoix and Alexandre Barreto; and is hereby incorporated by reference herein for all purposes.

TECHNICAL FIELD

The present disclosure relates to digital-to-analog converters (DACs) and, more particularly, to a Sigma-Delta DAC with an M-bit resolution quantizer having digital inputs that are rounded with respect to a random or pseudo-random sequence to provide automatic dynamic dithering for removing undesired idle tones in the analog output of the Sigma-Delta DAC.

BACKGROUND

Digital-to-Analog converters (DACs) are in widespread use today in electronic applications for consumer, medical, industrial, etc. Typically, DACs include circuitry for receiving a digital value and outputting an analog signal that is determined by the digital value. The digital output value is typically in the form of either a parallel word or a serial digital bit string. There are many types of digital-to-analog conversion schemes and, each of these conversion schemes has its advantages and disadvantages.

One type of DAC that has seen increasing use is the Sigma-Delta DAC (Sigma-Delta and Delta-Sigma will be used interchangeably herein). The Sigma-Delta DAC utilizes a Sigma-Delta modulator where digital values are input to the Sigma-Delta modulator and the output thereof is filtered to produce the analog signal and remove noise, e.g., an audio class-D power amplifier. A Sigma-Delta modulator in a DAC typically converts input digital values to a digital serial string of "ones" and "zeros" having an average amplitude over time proportional to the analog signal represented by the digital values. This digital serial string is filtered with an analog circuit low pass filter to produce the desired analog signal. Sigma-Delta modulation generally provides for high accuracy and wide dynamic range as compared to earlier delta modulation techniques. Sigma-Delta modulation is often referred to as an oversampled converter architecture and is typically immune from some of the earlier undesirable second order effects of delta modulation.

All Sigma-Delta modulators, working in a continuous mode, produce idle tones at their outputs if a certain periodic or DC input is provided. These idle tones are due to the quantization process and are inherent in the design of the Sigma-Delta modulator architecture.

These idle tones are unwanted and create undesired behavior at the output of the DAC, e.g., undesired high tones in an audio device. These tones limit the spurious free dynamic range (SFDR) and thus the signal-to-noise-and-distortion (SINAD) of the DAC device. These tones have an amplitude and frequency that is largely dependent on the input signal which prevents their removal with a simple filtering of the output signal.

SUMMARY

Therefore what is needed is a way to remove idle tones from the output of a digital-to-analog converter (DAC). According to the teachings of this disclosure, removal of idle tones from the output of a Sigma-Delta digital-to-analog converter (DAC) is accomplished by using dithering techniques to add an error signal in the Sigma-Delta modulator loop, thereby de-correlating the idle tone output so that the idle tones are attenuated or canceled. This error signal is usually a random high frequency signal, with a zero average so that it is filtered by the Sigma-Delta loop. The randomness of the error signal (its non-correlation with the input signal) determines the efficiency of the dithering scheme. In a Sigma-Delta DAC, the Sigma-Delta modulator is purely digital as more fully described hereinbelow.

A Sigma-Delta DAC, according to teachings of this disclosure, comprises a Sigma-Delta M-bit (M>1) multi-bit modulator having a random or pseudo-random sequence generator that controls a resolution sequence $N(n)$ and a rounding/truncation block that rounds an L-bit resolution input signal to an $N(n)$ bit signal with $M-N(n)$ padded zeros. The pseudo-random or random generator may be freely chosen, and depending on the probability to generate large $N(n)$ numbers, the dithering function will be introducing more or less large errors in the modulator loop. If the resolution sequence is generating large $N(n)$ numbers, the dithering error function will be introducing small errors no matter what the digital input of the quantizer is. One of the preferred trade-offs between the amount of dithering and the amount of error introduced in the loop is found when the resolution sequence generated is an integer number between 1 and M with a probability of $1/M$.

According to a specific example embodiment of this disclosure, an apparatus for reduction of unwanted idle tones by dithering a digital signal in a multi-bit sigma-delta digital-to-analog converter (DAC) comprises: a sigma-delta multi-bit modulator having a digital signal input and a variable resolution output, the sigma-delta M-bit (M>1) multi-bit modulator comprising: a digital loop filter, a random sequence generator, and variable resolution quantizer, wherein the digital loop filter receives a digital signal at the digital signal input and converts the digital signal to L-bit digital words, the random sequence generator creates a plurality of random numbers $N(n)$ in a sequence, where $N(n)$ are random integer numbers between 1 and M, and the variable resolution quantizer reduces the L-bit digital words to $N(n)$-bit digital words and then adds zeros to the $N(n)$-bit digital words to form M-bit digital words, where M is greater than $N(n)$ and $M-N(n)$ least significant bits of the M-bit digital words are zeros; a multi-bit digital-to-analog converter (DAC); and an analog low pass filter.

According to another specific example embodiment of this disclosure, an apparatus for reduction of unwanted idle tones by dithering a digital signal in a multi-bit (M-bit, M>1) sigma-delta digital-to-analog converter (DAC) comprises: a sigma-delta multi-bit modulator having a digital signal input and a plurality of variable resolution outputs, the sigma-delta multi-bit modulator comprising: a digital loop filter, a plurality of random sequence generators, and a plurality of variable resolution quantizers, wherein the digital loop filter receives a digital signal at the digital signal input and converts the digital signal to L-bit digital words, each of the plurality of random sequence generators creates a plurality of random numbers $N(n)$ in a sequence, where $N(n)$ are random integer numbers between 1 and M, and each of the plurality of variable resolution quantizers reduces the L-bit digital words to N(n)-bit digital words and then adds zeros to the N(n)-bit digital words to form M-bit digital words, where M is greater than N(n) and M−N(n) least significant bits of the M-bit digital words are zeros; a plurality of multi-bit digital-to-analog converters (DACs), each of the plurality of multi-bit DACs having an analog output and a digital input coupled to a respective one of the plurality of variable resolution outputs from the sigma-delta multi-bit modulator; and an analog low pass filter having a plurality of analog inputs coupled to respective outputs of the plurality of multi-bit DACs.

According to yet another specific example embodiment of this disclosure, a method for reducing unwanted idle tones by dithering a digital signal in a multi-bit sigma-delta M-bit modulator, said method comprising the steps of: converting digital signals into L-bit digital words with a digital loop filter; generating random number sequences N(n) with a random sequence generator, where N(n) are random integer numbers between 1 and M; generating N(n)-bit digital words from the L-bit digital words; and generating M-bit digital words by adding zeros to the N(n)-bit digital words to create the M-bit digital words, where M is greater than N(n), and M−N(n) least significant bits of the M-bit digital words are zero.

BRIEF DESCRIPTION OF THE DRAWINGS

A more complete understanding of the present disclosure thereof may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Figure 1:
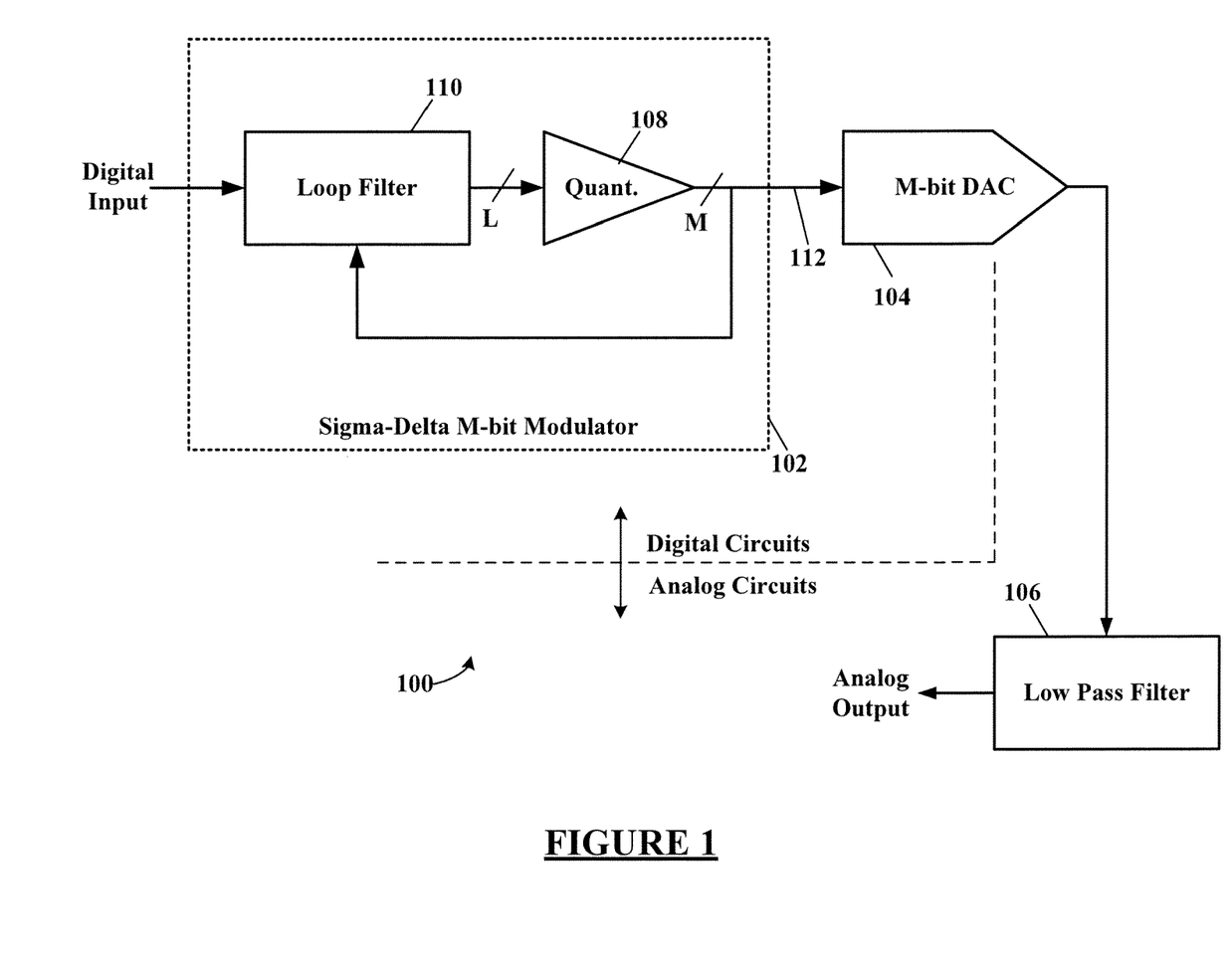
FIG. 1 illustrates a schematic block diagram of a single-loop Sigma-Delta digital-to-analog converter (DAC) with a multi-bit quantizer.

Referring to FIG. 1, depicted is a schematic block diagram of a single-loop Sigma-Delta digital-to-analog converter (DAC) with a multi-bit quantizer. The Sigma-Delta DAC, generally represented by the numeral 100, comprises a single-loop Sigma-Delta M-bit modulator 102, an M-bit digital-to-analog converter 104 and an analog low pass filter 106. The Sigma-Delta modulator 102 comprises a digital loop filter 110 and a fixed resolution quantizer 108. The Sigma-Delta modulator 102 may also use multiple feedback loops in its design.

The fixed resolution quantizer 108 processes an L-bit word at its input(s) and provides an M-bit word at its output(s) (where L>=M). The fixed resolution quantizer 108 typically does a simple M-bit truncation by truncating the L-bit input word into an M-bit output word by nullifying the L−M least significant bits while the M most significant bits are left unchanged. M is the resolution of the fixed resolution quantizer 108. When M>1, the quantizer output is multi-bit and thus the Sigma-Delta DAC is multi-bit (M-bit) also. The Sigma-Delta DAC may incorporate one or more quantizers (cascade architectures), one or more feedback and feed-forward loops, etc. A single loop multi-bit in the Sigma-Delta modulator 102 is illustrated in FIG. 1. The quantizing process of L to M bits may be, but is not limited to, a truncation or a round operation. A round operation is preferred because it lowers the quantization error but requires more circuitry to perform (typically requires an adder whereas a truncation operation does not require any adder).

Figure 2:
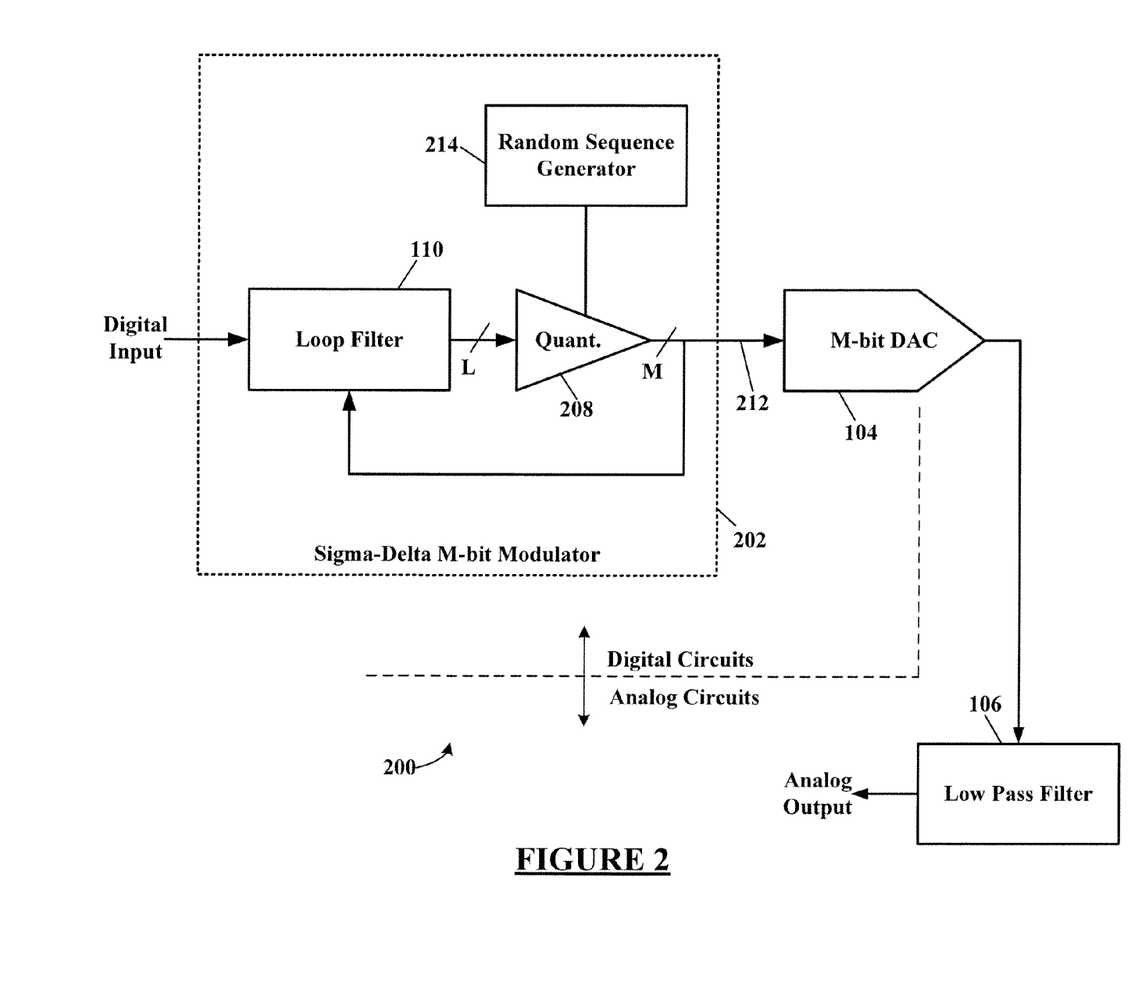
FIG. 2 illustrates a schematic block diagram of a single-loop Sigma-Delta DAC with a variable resolution quantizer and random sequence generator, according to a specific example embodiment of this disclosure.

Referring to FIG. 2, depicted is a schematic block diagram of a single-loop Sigma-Delta DAC with a variable resolution quantizer and random sequence generator, according to a specific example embodiment of this disclosure. The Sigma-Delta DAC, generally represented by the numeral 200, comprises a single-loop Sigma-Delta M-bit (M>1) modulator 202, an M-bit digital-to-analog converter (DAC) 104, and an analog low pass filter 106. The Sigma-Delta modulator 202 comprises a digital loop filter 110, a variable resolution quantizer 208 and a random sequence generator 214. The Sigma-Delta modulator 202 may also use multiple feedback loops in its design, and multiple feedback loop operation is contemplated herein. The variable resolution quantizer 208 may be an M-bit truncator or rounder and has an M-bit output as more fully described herein.

The multi-bit (M-bit, M>1) Sigma-Delta DAC 200 may have at least one multi-bit variable resolution quantizer 208 whose resolution varies with respect to a random or pseudo-random sequence generated by the random sequence generator 214. The resolution sequence from the variable resolution quantizer 208 acts as a dithering algorithm and provides automatic dynamic dithering that effectively allows removal of undesired idle tones in the analog output of the Sigma-Delta DAC 200. The Sigma-Delta DAC 200 may be a single-loop (e.g., as shown in FIG. 1), multi-loop or a cascade architecture. It is contemplated and within the scope of this disclosure that the Sigma-Delta DAC 200 may be comprised of one or more variable multi-bit resolution quantizers 208 driven by one or more random or pseudo-random sequences from one or more random sequence generators 214. The output of the variable resolution quantizer 208 shown in FIG. 2 has M bits. However, any number of bits output may be used and is contemplated herein.

Figure 3:
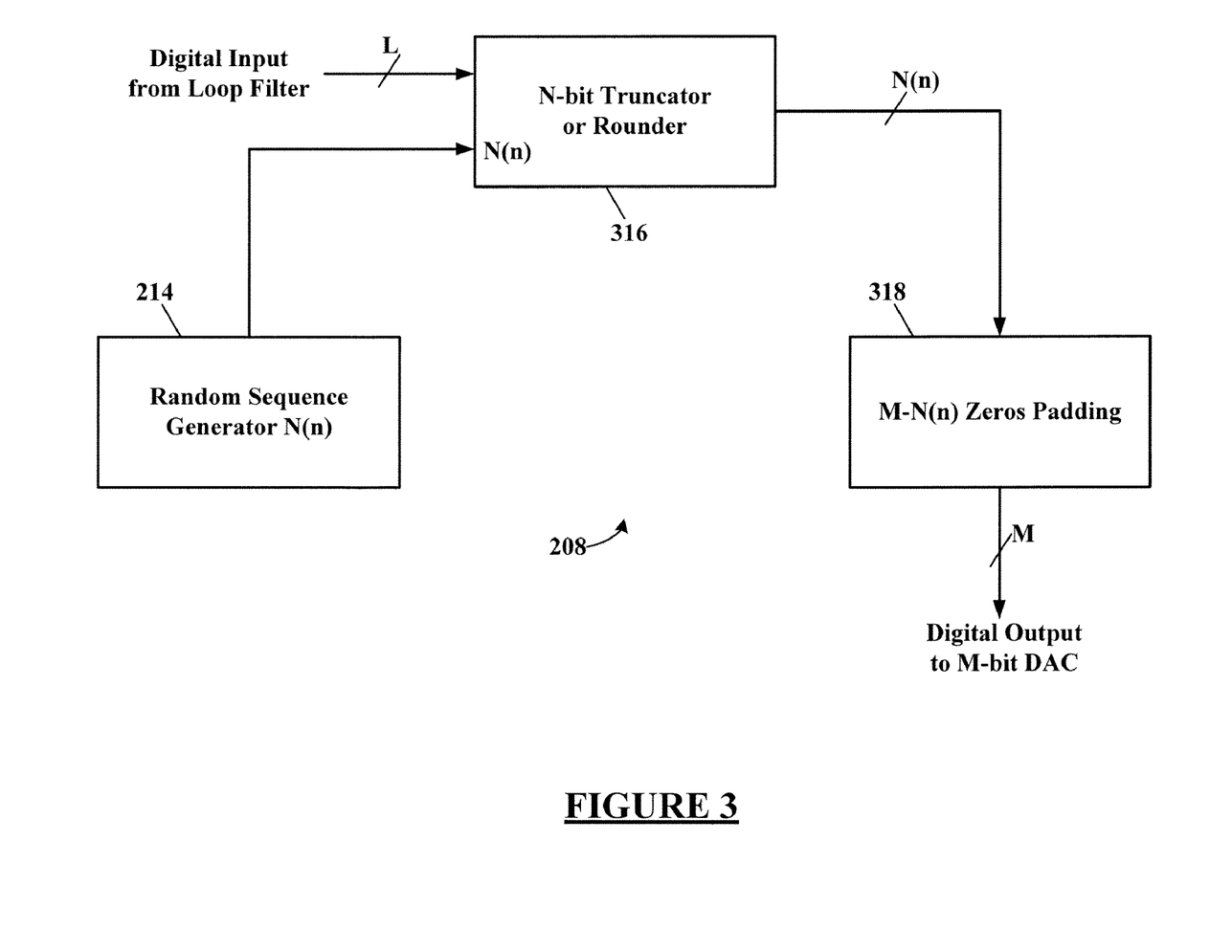
FIG. 3 illustrates a schematic block diagram of a variable resolution quantizer and random sequence generator, according to the specific example embodiment of this disclosure.
Figure 4:
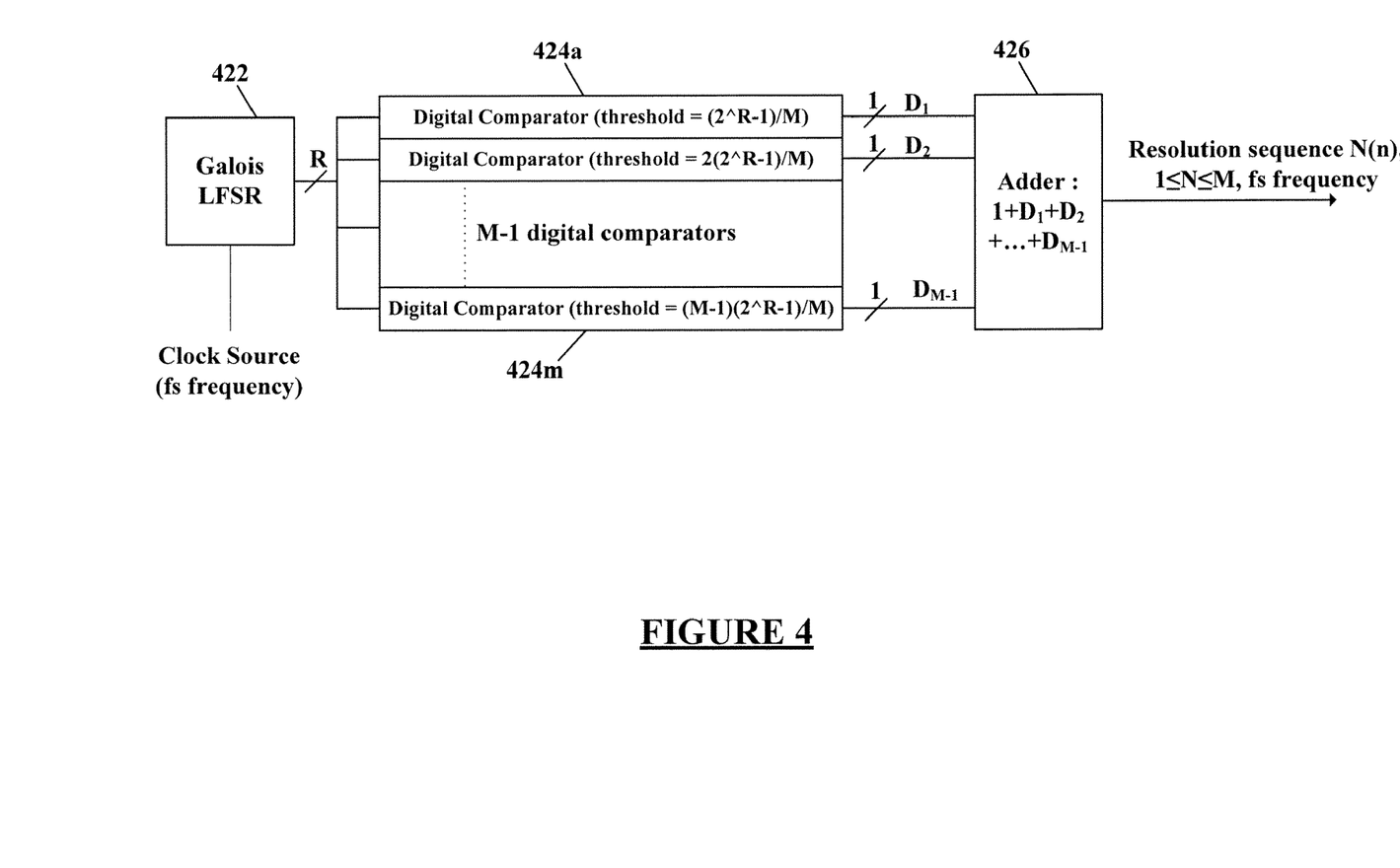
FIG. 4 illustrates a more detailed schematic block diagram of the random sequence generator shown in FIGS. 2 and 3, according to the specific example embodiment of this disclosure.

Referring now to FIG. 3, depicted is a more detailed schematic block diagram of a variable resolution quantizer and random sequence generator, according to a specific example embodiment of this disclosure. The variable resolution quantizer, generally represented by the numeral 208, comprises an N-bit truncator or rounder 316, and a zeros padding function block 318. At each sample n, a random integer number between 1 and M called N(n) follows a random or pseudo-random sequence. The random number sequence N(n) is called a resolution sequence. The resolution sequence, N(n), is determined by a random or pseudo-random sequence generator 214, e.g., Galois linear feedback shift register (LFSR), digital comparators and an adder as more fully described hereinafter (FIG. 4).

An L-bit word from the loop filter 110 (FIG. 2) is clocked at a certain frequency fs into an input of the N-bit truncator or rounder 316 of the variable resolution quantizer 208. At each sample at the frequency fs, the N-bit truncator or rounder 316 rounds (or truncates) the L-bit digital word into an N(n)-bit digital word. The output from the N-bit truncator or rounder 316 is then padded with zeros in the zeros padding function block 318 in order to form M-bit digital words to be sent to the M-bit DAC 104 (FIG. 2). The zeros padding function block 318 forces the M−N(n) least significant bits in each M-bit digital word input to zero. Thereby forming new M-bit words containing the signal information (digital words to be converted to analog signal values) with an N(n)-bit resolution. Thus the L-bit digital words are encoded into M-bit digital words having a variable resolution sequence N(n).

Compared with a fixed resolution M-bit quantizer (FIG. 1), the variable resolution quantizer with an N(n) resolution sequence introduces an additional quantization error dependant upon N(n). The error signal is the difference between the input signal (L) rounded to M-bit and the input signal rounded to N(n) bits at each sample. Since N(n) is random or pseudo-random, it is not correlated with the input signal. Since the average quantization error of the rounding process is 0 over the full dynamic input range, and since the quantization is done at the maximum sampling frequency fs, the variable resolution rounding process adds a non-correlated, high frequency, zero average signal that effectively introduces dithering to the digital signal. By dithering the digital signal, the idle tones are "broken" and "scrambled" by the addition of a random or pseudo-random error signal at the digital input of the Sigma-Delta quantizer, whereby the random or pseudo-random signal will be filtered by the Sigma-Delta modulator loop and the low-pass filter analog output stage, thus no additional filtering is needed at the analog output to recover the desired signal minus the undesired idle tones.

The rounding operation may be a truncation, a round or a floor operation. The floor or round operation requires an adder, wherein the truncation operation requires the least amount of circuitry in order to change the M−N(n) bits to 0. However, the rounding scheme is preferred because it minimizes the error signal and thus minimizes the addition of error into the output signal, while maintaining the same level of de-correlation with the input as the truncation or floor operations.

A specific example, according to the teachings of this disclosure, removes the error signal induced by the variable quantizer for large input signals no matter what the resolution sequence is and thereby performs automatic dynamic dithering. When M>2 and the output signal coding is 2's complement with an overflow bit (which is often used for the Sigma-delta DAC coding scheme), the digital output signal can go from 110...0 to 010...0, or in decimal from $-2^{M-2}$ to $+2^{M-2}$, taking $2^{M-1}+1$ possible values. In this case, the largest values at the quantizer input are not changed when rounding to N-bits (N>1) no matter what the N value may be. This means the dithering performed is also automatically dynamic, since the quantization error is substantially unchanged for large absolute digital value inputs to the quantizer no matter what the sequence is, and thus provides very stable performance.

An example of the variable quantizer outputs for a 3 sample sequence is as follows for L=4; N(n) sequence for the 3 first samples: 1, 2, 3; M=3, and truncation method for the rounder:

Digital input on L bits=XXXX, YYYY, ZZZZ
Output of N-bit truncator on N(n) bits: X, YY, ZZZ
Digital output of the variable resolution quantizer on M bits: X00, YY0, ZZZ Referring to FIG. 4, depicted is a more detailed schematic block diagram of a sequence generator as shown in FIGS. 2 and 3, according to a specific example embodiment of this disclosure. A simple random sequence generator 214 may comprise an R-bit Galois LFSR (Linear Feedback Shift Register) 422, M−1 parallel digital comparators 424 and a simple adder 426. This random sequence generator 214 has an equiprobable distribution and generates equiprobable integer numbers N(n) in a pseudo-random sequence, N(n) being between 1 and M. The random sequence generator 214 is equiprobable if $(2^R-1)$ is a multiple of M since all integer numbers are taken in the LFSR register from 1 to $2^R-1$ only once per full cycle of the LFSR 422. The sequence length will determine the ability of the dithering algorithm to cancel the undesired idle tones. With a long sequence, even the low-frequency idle tones will be scrambled, and when the sequence is short, only the high-frequencies are dithered. Implementation of the teachings of this disclosure into Sigma-Delta DACs is simple to put in place and does not require much more additional circuitry than a standard multi-bit quantizer while providing efficient idle tone scrambling and substantial elimination thereof.

Figure 5:
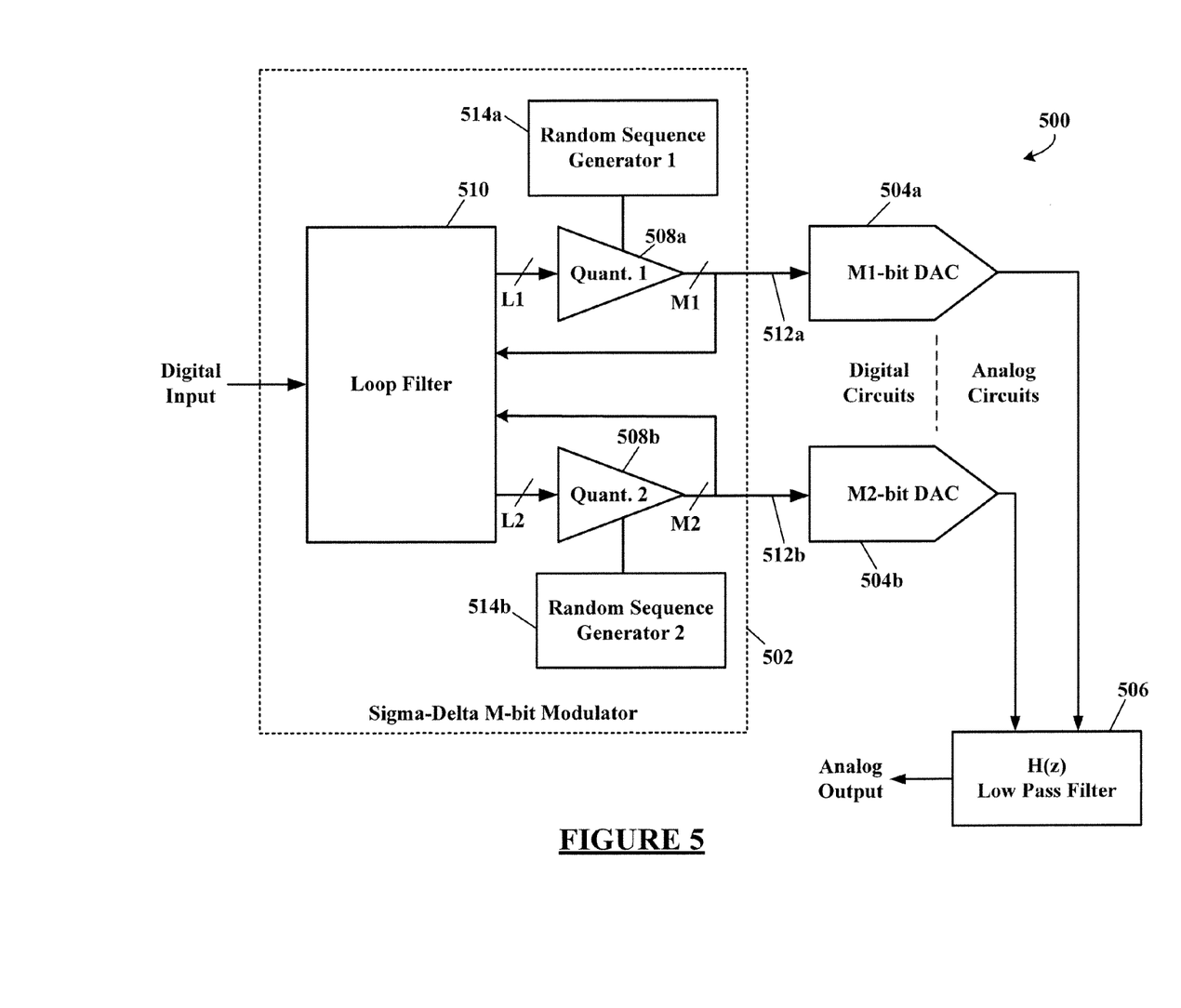
FIG. 5 illustrates a schematic block diagram of a multi-bit dual truncation Sigma-Delta DAC with two variable resolution quantizers and two random sequence generators, according to another specific example embodiment of this disclosure.

Referring to FIG. 5, depicted is a schematic block diagram of a multi-bit dual truncation Sigma-Delta DAC with two variable resolution quantizers and two random sequence generators, according to another specific example embodiment of this disclosure. The multi-bit dual truncation Sigma-Delta DAC, generally represented by the numeral 500, comprises a two-loop Sigma-Delta M-bit (M>1) modulator 502, multi-bit digital-to-analog converters (DACs) 504a and 504b, and a dual input analog low pass filter 506. The Sigma-Delta modulator 502 comprises a digital loop filter 510, variable resolution quantizers 508a and 508b, and random sequence generators 514a and 514b. The Sigma-Delta modulator 502 uses multiple feedback loops in its design, and multiple feedback loop operation is contemplated herein. The variable resolution quantizers 508 may be multi-bit truncators or rounders and have multi-bit outputs as more fully described herein.

The Sigma-Delta DAC 500 may be multi-loop or have a cascade architecture. It is contemplated and within the scope of this disclosure that the Sigma-Delta DAC 500 may be comprised of a plurality of variable multi-bit resolution quantizers 508, each driven by one or more random or pseudo-random sequences from one or more random sequence generators 514.

The multi-bit (M-bit, M>1) Sigma-Delta DAC 500 may have at least two multi-bit variable resolution quantizers 508 whose resolution varies with respect to a random or pseudo-random sequence generated by the random sequence generators 514. The resolution sequence from the variable resolution quantizers 508 act as dithering algorithms and provide automatic dynamic dithering that effectively allows removal of undesired idle tones in the analog output of the Sigma-Delta DAC 500.

The outputs of the variable resolution quantizers 508a and 508b shown in FIG. 5 have M1 and M2 bits, respectively. The variable resolution quantizers 508a and 508b may have the same or different numbers of bits outputs, e.g., M1=3 and M2=4, and any number of bits outputs may be used and are contemplated herein. The multi-bit inputs of the DACs 504a and 504b would match the number of bits outputs from the variable resolution quantizers 508a and 508b, respectively. Also one of the quantizers 508 may be fixed resolution and the other quantizer 508 may be variable resolution.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for reduction of unwanted idle tones by dithering a digital signal in a multi-bit (M-bit, M>1) sigma-delta digital-to-analog converter (DAC), comprising:
    a sigma-delta multi-bit modulator having a digital signal input and a plurality of variable resolution outputs, the sigma-delta multi-bit modulator comprising:
        a digital loop filter,
        a plurality of random sequence generators, and
        a plurality of variable resolution quantizers,
    wherein
        the digital loop filter receives a digital signal at the digital signal input and converts the digital signal to L-bit digital words,
        each of the plurality of random sequence generators creates a plurality of random numbers N(n) in a sequence, where N(n) are random integer numbers between 1 and M, and
        each of the plurality of variable resolution quantizers reduces the L-bit digital words to N(n)-bit digital words and then adds zeros to the N(n)-bit digital words to form M-bit digital words, where M is greater than N(n) and M-N(n) least significant bits of the M-bit digital words are zeros;
    a plurality of multi-bit digital-to-analog converters (DACs), each of the plurality of multi-bit DACs having an analog output and a digital input coupled to a respective one of the plurality of variable resolution outputs from the sigma-delta multi-bit modulator; and
    an analog low pass filter having a plurality of analog inputs coupled to respective outputs of the plurality of multi-bit DACs.

2. The apparatus according to claim 1, wherein each of the outputs of the plurality of variable resolution quantizers has a different number of bits then the others.

3. The apparatus according to claim 1, wherein the outputs of the plurality of variable resolution quantizers have the same number of bits.

4. The apparatus according to claim 1, wherein one of the plurality of variable resolution quantizers has a three bit output and another one of the plurality of variable resolution quantizers has a four bit output.

5. The apparatus according to claim 1, wherein each of the plurality of random sequence generators comprises:
    a linear feedback shift register (LFSR) having an R-bit output;
    a plurality of digital comparators, each of the plurality of digital comparators having a different digital threshold, an R-bit digital input coupled to the LFSR, and a digital output; and
    a digital adder having inputs coupled to the digital outputs of the plurality of digital comparators, and an output coupled to the variable resolution quantizer.

6. The apparatus according to claim 5, wherein the LFSR is a Galois LFSR.

7. The apparatus according to claim 1, wherein each of the plurality of variable resolution quantizers comprises:
    an N-bit truncator having an L-bit input, an N(n)-bit input and an N(n)-bit output, wherein the L-bit input is coupled to the digital loop filter for receiving the L-bit digital words and the N-bit input is coupled to the random sequence generator; and
    a zeros padding function coupled to the N(n)-bit output of the N-bit truncator, wherein the zeros padding function adds zeros to M-N(n) least significant bits of the M-bit digital words.

8. The apparatus according to claim 1, wherein each of the plurality of variable resolution quantizers comprises:
    an N-bit rounder having an L-bit input, an N(n)-bit input and an N(n)-bit output, wherein the L-bit input is coupled to the digital loop filter for receiving the L-bit digital words and the N-bit input is coupled to the random sequence generator; and
    a zeros padding function coupled to the N(n)-bit output of the N-bit rounder, wherein the zeros padding function adds zeros to M-N(n) least significant bits of the M-bit digital words.

9. The apparatus according to claim 1, wherein sampling of the L-bit digital words and generation of respective ones of the random number sequences N(n) occur at substantially the same times.

10. The apparatus according to claim 1, wherein sampling of the L-bit digital words and generation of respective ones of the random number sequences N(n) occur at frequency fs intervals.

* * * * *